United States Patent [19]

Algiere et al.

[11] Patent Number: 5,053,731
[45] Date of Patent: Oct. 1, 1991

[54] SOFTWARE RECONFIGURABLE TRANSMISSION LINE APPARATUS

[75] Inventors: John L. Algiere, Loveland; Tom T. Sesnic, Ft. Collins, both of Colo.

[73] Assignee: Hewlett-Packard Company, Palo Alto, Calif.

[21] Appl. No.: 582,264

[22] Filed: Sep. 12, 1990

[51] Int. Cl.⁵ .............................................. H03H 7/48
[52] U.S. Cl. ..................................... 333/101; 333/105
[58] Field of Search ........................ 333/101, 103, 105; 307/115, 242; 370/53; 340/825, 825.79

[56] References Cited

U.S. PATENT DOCUMENTS 3,808,566  4/1974  Thompson et al. ............. 333/101 X
4,788,541  11/1988  Yamanaka ........................... 340/825
4,928,022  5/1990  Marum ............................ 307/242 X

OTHER PUBLICATIONS

EDI catalog, p. 14.

Primary Examiner—Paul Gensler

[57] ABSTRACT

The software reconfigurable transmission line apparatus uses a multi layer printed circuit board on which is deposited a plurality of signal conductors and associated ground plane conductors. The signal conductors and ground plane conductors are oriented in a parallel juxtaposed configuration such that they implement a two wire shielded transmission line. Switching devices located at either end of each of these conductors are operable under software control to reconfigure the connection of these conductors to their associated terminals to implement two wire floating or coax transmission lines.

25 Claims, 2 Drawing Sheets

SOFTWARE RECONFIGURABLE TRANSMISSION LINE APPARATUS

FIELD OF THE INVENTION

This invention relates to transmission lines and, in particular, to a plurality of conductors deposited on a printed circuit board which are switchably interconnectable under software control to realize various transmission line and impedance configurations.

PROBLEM

It is a problem in the field of multiplexers to interconnect a plurality of equipment which may have differing termination characteristics. The existing multiplexers use printed circuit boards that contain either single conductor, transmission line signal paths or floating two wire signal paths to interconnect a plurality of equipment with a number of terminations. The selected form of signal path is uniform throughout the entire printed circuit board and these multiplexers can therefore provide only a single type of termination to the equipment. In many applications, diverse types of equipment need to be concurrently or successively multiplexed and this presently is accomplished by manually inserting a converter between the equipment and the multiplexer to provide the desired signal path termination.

These prior art multiplexers implement the transmission line signal paths on a printed circuit board using strip line or microstrip layout techniques. A ground plane is typically provided for the single ended coax transmission line to realize a shield which is common to multiple signal traces. Alternatively, each signal trace is provided with its own ground plane. In either case, each signal path on the printed circuit board is a fixed impedance (e.g. - fifty ohms) impedance and is intended to be used only with instruments and circuits that function in a fifty ohm coax transmission line environment. In the case of two wire floating signal paths, this signal path is implemented as two approximately parallel traces on the printed circuit board. No ground plane is provided and this structure is used when low frequency, high precision measurements must be made. Again, this configuration is fixed and limits the type of instruments and circuits that can be interconnected to the multiplexer.

SOLUTION

The above described problems are solved and a technical advance achieved in the field by the software reconfigurable transmission line apparatus of the present invention. This apparatus is implemented using a multi layer printed circuit board on which is deposited a plurality of signal conductors and associated ground plane conductors. These signal conductors and ground plane conductors are oriented in a parallel juxtaposed configuration such that they are configured as at least one two wire signal path with associated ground plane conductors. These conductors are each connected to equipment terminations via associated switching devices located at both ends of the signal path. A processor (or externally generated control signals) is used to selectively activate the switching devices to reconfigure the transmission line configuration. By activating the switching devices at both ends of one signal path, this two wire transmission line is reconfigured into a single conductor shielded transmission line. In this configuration only one single path is used as the center conductor of the transmission line. Alternatively, the switching devices can be activated to interconnect both signal paths to their associated equipment terminations to form a floating two wire transmission line. This configuration can be either shield terminated or shield unterminated, as necessary to match the equipment connected thereto. In this manner, a single printed circuit board structure with its associated switching devices can be used to implement a number of transmission line configurations to thereby interface a number of types of equipment or circuits.

DETAILED DESCRIPTION

Figure 1:
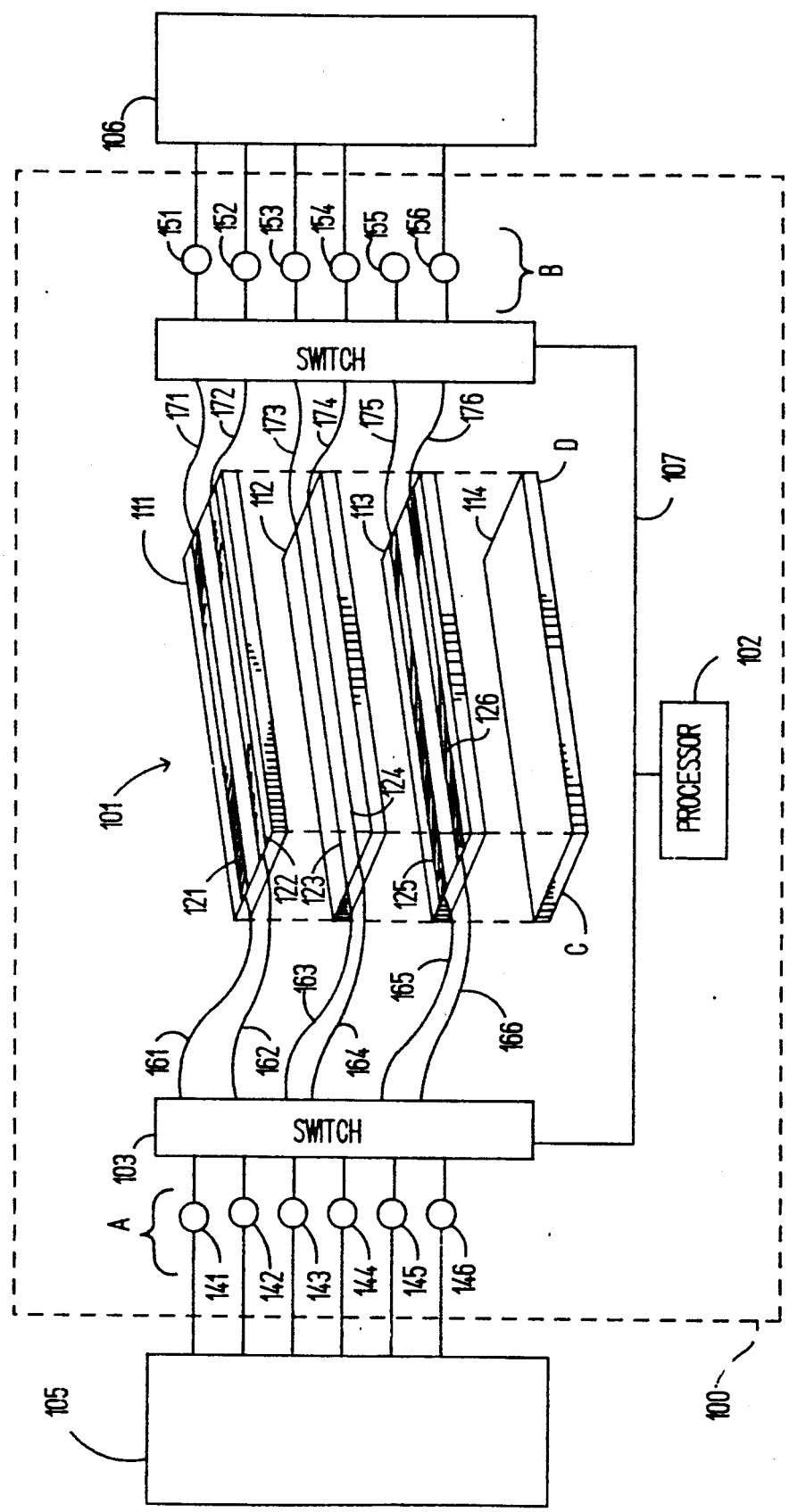
FIG. 1 illustrates the overall architecture of the software reconfigurable transmission line apparatus including the printed circuit board with the signal paths and ground planes deposited thereon.

FIG. 1 illustrates the architecture of the software reconfigurable transmission line apparatus 100. This apparatus 100 includes a multilayer printed circuit board 101 whose conductors 121-126 are switchably connected via switching devices 103, 104 to associated terminals 141-146, 151-156. Processor 102 controls the operation of switching devices 103, 104 to reconfigure the transmission line configuration of conductors 121-126 under software control.

Printed Circuit Board 101

The printed circuit board 101 comprises a multilayer structure such as the well known glass epoxy printed circuit board. Multilayer printed circuit board 101 consists of a plurality of individual layers 111-114 of printed circuit board of the glass epoxy type, which layers 111-114 are laminated together in the manufacturing process to form a unitary structure. Conductor patterns can be deposited on each of these layers 111-114 to form circuit interconnections and through holes or vias are machined through these layers 111-114 to interconnect conductors on the various layers. The use of a multilayer printed circuit board 101 is advantageous in that it permits the deposition of various geometries of signal conductors 123, 124 and ground planes 121, 122 and 125, 126 to implement coaxial cable type transmission lines as well as simple multiconductor floating signal leads. The geometry of traces used to implement the various signal conductors 123, 124 and ground planes 121, 122 and 125, 126 deposited on the layers 112, and 111, 113, respectively of the printed circuit board 101 are configurable to match the specific needs of various transmission line implementations.

For the purpose of simplicity of description, straight line conductors 121-126 are illustrated to demonstrate the concepts of this invention. The apparatus 100 of FIG. 1 illustrates two straight line signal conductors 123, 124 deposited on one layer 112 of printed circuit board 101. Signal conductors 123, 124 are oriented parallel to each other and extend from a first end to a second end of layer 112 of printed circuit board 101. A second layer 113 of printed circuit board 101 is coplanar with first layer 112 and carries two ground plane conductors 125, 126 deposited thereon. Ground plane conductors 125, 126 are oriented parallel to each other and extend from a first end to a second end of layer 113 of printed circuit board 101. Ground plane conductors 125, 126 are deposited on layer 113 in a position and orientation to be directly below signal conductors 123, 124, respectively when layers 111–114 are laminated together. Ground plane conductors 125, 126 are typically five to ten times the width of signal conductors 123, 124 and serve as a shield for their respective signal conductors 123, 124. A typical configuration of these conductors would provide a fifty ohm impedance between each signal conductor 123, 124 and its associated ground plane conductor 125, 126 and a one hundred ohm impedance between signal conductors 123, 124 when adjacent ground plane conductors 125, 126 are interconnected to form a single ground plane. In addition, ground plane conductors 121, 122 can be used with signal conductors 123, 124 in place of or in conjunction with ground plane conductors 125, 126. For simplicity of description, a configuration using signal conductors 123, 124 and a single set of ground plane conductors 125, 126 is described below.

Switching Devices 103, 104

Figure 2:
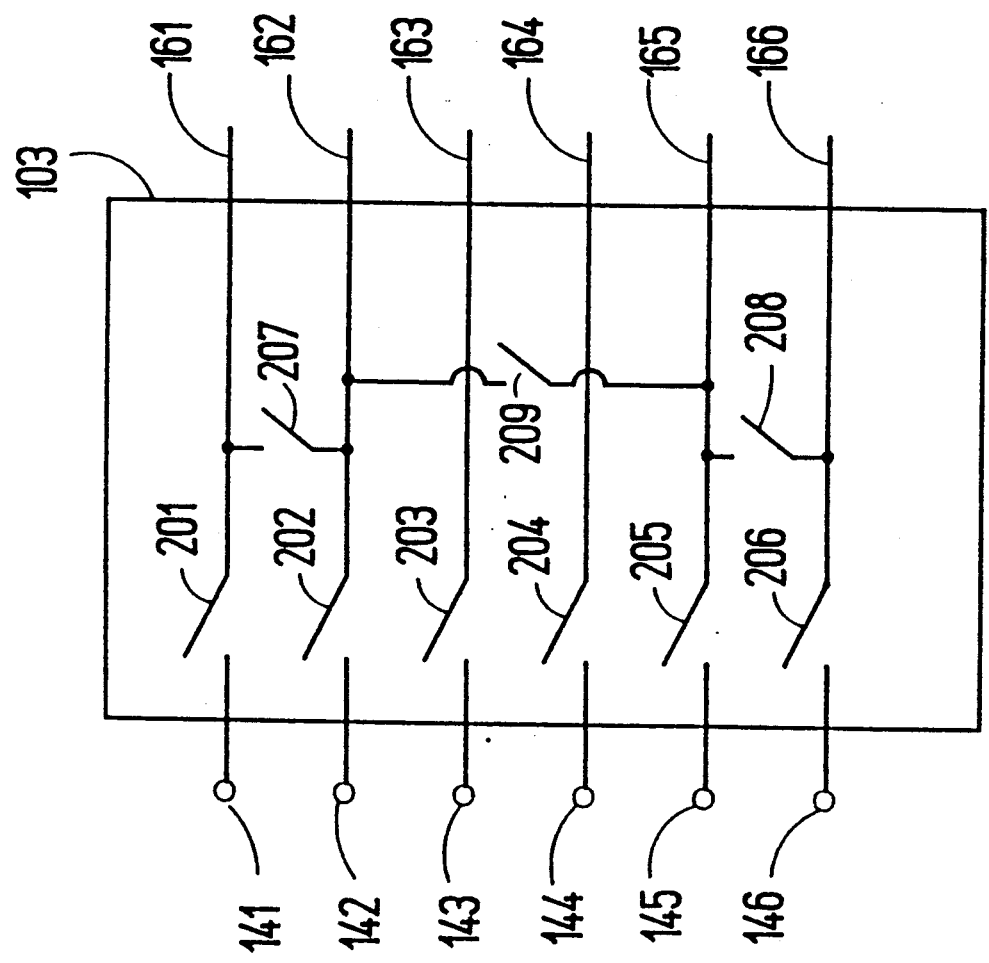
FIG. 2 illustrates a circuit diagram of a typical implementation of the switching apparatus.

FIG. 2 illustrates a typical Circuit implementation of one of the switching devices 103 illustrated in FIG. 1. The elements illustrated in FIGS. 1 and 2 are numbered consistently to illustrate the correspondence therebetween.

The selective interconnection of the signal conductors 123, 124 and ground plane conductors 125, 126 is accomplished by a switching circuit 103, 104 which operates in response to control signals received from a controller, such as a processor 102 to switchably interconnect these signal conductors 123, 124 and ground plane conductors 125, 126 to associated terminals 143–146, 153–156. In particular, a plurality of terminals 143–146, 153–156 are provided either on the printed circuit board 101 or in conjunction therewith to interface these transmission line conductors 123–126 with external circuitry 105, 106. Each of the signal conductors 123, 124 and ground plane conductors 125, 126 illustrated in FIG. 1 includes a first end (C) connectable via associated leads 163–166 and switching device 103 to an associated terminal 143–146 for connection to, for example, an external load 105. Each of the signal conductors 123, 124 and ground plane conductors 125, 126 also includes a second end (D) which is also switchably connectable to via leads 173–176 and switching device 104 to associated terminals 153–156. The second ends (D) of the signal conductors 123, 124 and ground plane conductors 125, 126 may be, for example, connected via the associated terminals 153–156 to associated test or drive circuitry 106. There are a number of possible configurations of the signal conductors 123, 124 and ground plane conductors 125, 126 into a transmission line, which configurations are a function of the interconnection required between the loads 105 placed at the first end (C) of the transmission lines and the driving or test circuitry 106 at the second end (D) of the transmission line.

Switching devices 103, 104 can be implemented by the use of an appropriate set of devices, such as relays, selected to interconnect the conductors 123–126 and their associated terminals 143–146, 153–156. FIG. 2 illustrates schematically the interconnection function performed by a plurality of relays 201–209 which are used in switching device 103. A similar configuration (not shown) of relays is used to implement switching device 104 to interconnect terminals 151–156 with leads 171–176. Relays 201–206, are each operable to either connect or disconnect conductors 121–126 (via leads 161–166) with their associated terminals 141–146. Relays 207 and 208 are operable to interconnect ground plane conductors 121, 122 and 125, 126 and relay 209 is operable to interconnect ground plane conductors 121, 122, 125, 126 to provide a single common ground plane for signal conductors 123, 124.

Shield Terminated at Instrument End Differential Mode

In the transmission of low frequency signals, it is undesirable to terminate the transmission line ground plane conductors 125, 126 on both ends C, D since this can create ground loops and induce noise into the signal carried on the signal conductors 123, 124. Therefore, the ground plane conductors 125, 126 for the signal conductors 123, 124 should be terminated on only one end. If for example the load 105 placed on the first end (C) of the line transmission via terminals 143–146 does not provide a ground on the ground plane conductors 125, 126 at their corresponding first ends C, the processor 102 transmits control signals to the switching circuit 103, 104 to thereby activate the relays located at the second end D of the ground plane conductors 125, 126 to interconnect these ground plane conductors 125, 126 with circuit ground located in test equipment 106 via corresponding terminals 155, 156. The switching circuit 103 concurrently activates the relays located at the first end C of the ground plane conductors 125, 126 to disconnect these conductors 125, 126 from their associated terminals 145, 146 and the load 105 that is connected thereto. In this manner, the ground plane conductors 125, 126 or shield for this transmission line are terminated with a circuit ground at one end D thereof, thereby implementing a shield terminated at instrument end differential mode transmission line.

Shield Terminated at Load End Differential Mode

In the case where the load 105 places a ground signal on the first end C of the ground plane conductors 125, 126, the processor 102 activates the switching circuit 103, 104 to interconnect the first end C of the ground plane conductors 125, 126 to their associated terminals 145, 146 to thereby ground this end (C) of the ground plane conductors 125, 126 using the circuit ground provided by the load 105 that is connected thereto. In order again to avoid the creation of a ground loop with the associated noise induction problems associated therewith, the switching circuit 104 concurrently activates the relays located at the second end D of the ground plane conductors 125, 126 to disconnect these ground plane conductors from circuit ground in test equipment 106 by disconnecting ground plane conductors 125, 126 from their associated terminals 155, 156 at the second end D thereof. This configuration realizes a shield terminated at load end differential mode transmission line.

Shield Terminated at Both Ends Differential Mode

In the transmission of high frequency signals, it is desirable to terminate the transmission line ground plane conductors 125, 126 on both ends C, D since this reduces high frequency noise into the signal carried on the signal conductors 123, 124. Therefore, the ground plane conductors 125, 126 for the signal conductors 123, 124 should be terminated on both ends. The processor 102 transmits control signals to the switching circuits 103, 104 to thereby activate the relays located at the first and second ends C, D of the ground plane conductors 125, 126 to interconnect these ground plane conductors 125, 126 with circuit ground located in test equipment 106 via corresponding terminals 155. 156 and with the circuit ground terminals 145, 146 associated with load 105. The switching circuit 103 concurrently activates the relays located at the first end C of the ground plane conductors 125, 126 to connect these conductors 125, 126 with their associated terminals 145, 146 and the load 105 that is connected thereto. In this manner, the ground plane conductors 125, 126 or shield for this transmission line are terminated with a circuit ground at both ends C, D thereof, thereby implementing a shield terminated at both ends differential mode transmission line.

Single Ended or Coaxial Mode

High frequency signals are typically not carried on a differential pair transmission line but, instead, are typically transmitted over a single ended or coaxial cable. In the coaxial transmission line mode, the processor 102 activates the switching circuits 103, 104 to cause the relays at the first C and second D end of a first one 123 of the signal conductors to interconnect this signal conductor 123 to its associated terminals 143, 153. The switching circuits 103, 104 concurrently deactivate the relays located at the first C and second D end of the second signal conductor 124 to disconnect this signal conductor 124 from its associated terminals 144, 154. This provides a single signal conductor 123 with its associated ground plane conductor 125 connected between the first set A of terminals 143, 145 and the second set B of terminals 153, 155. This is a coaxial cable type of transmission line where a single signal conductor 123 and its associated ground plane conductor 125 are connected between the first A and second B set of terminals. The signal conductor 123 carries one half of the desired signal while the interconnected shield or ground plane conductor 125 carries the other half of the of the desired signal between the first C and second D ends thereof.

Summary

Thus, this apparatus 100 is programmable in that it can be reconfigured among a plurality of transmission line configurations. The use of a pair of signal conductors 123, 124 deposited in a substantially parallel arrangement on one layer 112 of the printed circuit board 101, extending in a first direction across this layer 112 or the printed circuit board 101 from a first end thereof to a second end thereof provides the two signal conductors 123, 124 of a differential transmission line. The deposition of a second and third set of conductors 125, 126 and 121, 122 on a second and third layers 113, 111 substantially parallel to each other and to the signal conductors 123, 124 on the first layer 112 of the printed circuit board implements ground plane conductors 125, 126 and 121, 122 for the two signal conductors 123, 124. The ground plane conductors (e.g.—125, 126) can be either an individual ground plane conductor for each of the two signal conductors 123, 124 or a single common ground plane conductor for both of the signal conductors 123, 124. The ground plane conductors 125, 126 are located on a second layer 113 of the printed circuit board 101 and positioned directly underneath the signal conductors 123, 124 to thereby electrically provide a shield for the associated signal conductor 123, 124. These conductors 121-126 are switchably connectable via switching devices 103, 104 to associated terminals 141-146, 151-156 to implement either a two wire floating or coax transmission line.

While a specific embodiment of this invention has been disclosed, it is expected that those skilled in the art can and will design alternate embodiments of this invention that fall within the scope of the appended claims.

We claim:

1. A transmission line apparatus switchably connectable to a plurality of terminals comprising:
   printed circuit board means having a plurality of layers each of said layers capable of having at least one conductor deposited thereon;
   a plurality of signal conductors, deposited on a first one of said layers of said printed circuit board, oriented substantially parallel to each other, extending across said first layer of said printed circuit board in a first direction and each said signal conductor having a first and second end thereto;
   at least one ground plane conductor deposited on a second one of said layers of said printed circuit board, oriented substantially parallel to said plurality of signal conductors, extending across said second layer of said printed circuit board in said first direction and located directly below said plurality of signal conductors so as to be coextensive therewith, said ground plane conductor having first and second ends thereto;
   means connected to said plurality of signal conductors and said ground plane conductor for switchably connecting said first and second ends of said plurality of signal conductors and said ground plane conductor to said terminals.

2. The apparatus of claim 1, wherein said plurality of signal conductors comprise two conductors, said switchably connecting means comprises:
   relay means for selectively connecting each of said first and second ends of said two conductors and said ground plane to corresponding ones of said terminals.

3. The apparatus of claim 2 further including:
   means for activating said relay means to interconnect said first and second ends of one of said two conductors and said ground plane conductor to said corresponding terminals to implement a coaxial cable transmission line.

4. The apparatus of claim 2, wherein said terminals connectable to said first end of said two conductors and said ground plane conductor are connected to a load, said apparatus further including:
   means for activating said relay means to interconnect said first and second ends of said two conductors and said second end of said ground plane conductor to said corresponding terminals to implement a shield terminated at load end differential mode transmission line.

5. The apparatus of claim 2, wherein said terminals connectable to said first end of said two conductors and said ground plane conductor are connected to a load, said apparatus further including:
   means for activating said relay means to interconnect said first and second ends of said two conductors and said first end of said ground plane conductor to said corresponding terminals to implement a shield terminated at instrument end differential mode transmission line.

6. The apparatus of claim 2, wherein said terminals connectable to said first end of said two conductors and said ground plane conductor are connected to a load, said apparatus further including:

means for activating said relay means to interconnect said first and second ends of said two conductors and said first and second ends of said ground plane conductor to said corresponding terminals to implement a shield terminated at both ends differential mode transmission line.

7. The apparatus of claim 1 further comprising:

a second ground plane conductor deposited on a third one of said layers of said printed circuit board, oriented substantially parallel to said plurality of signal conductors, extending across said third layer of said printed circuit board in said first direction and located above said plurality of signal conductors so as to be coextensive therewith.

8. A transmission line apparatus switchably connectable to a plurality of terminals comprising:

printed circuit board means having a plurality of layers, each of said layers capable of having at least one conductor deposited thereon;

a plurality of signal conductors, deposited on a first one of said layers of said printed circuit board, oriented substantially parallel to each other, extending across said first layer of said printed circuit board in a first direction and each of said signal conductors having first and second ends thereto;

at least one ground plane conductor deposited on a second one of said layers of said printed circuit board, oriented substantially parallel to said plurality of signal conductors, extending across said second layer of said circuit board in said first direction and located directly below said plurality of signal conductors so as to be coextensive therewith and having first and second ends thereto;

means connected to said plurality of signal conductors and said ground plane conductor for switchably connecting said first and second ends of said plurality of signal conductors and said ground plane conductor to said terminals;

relay means for selectively connecting each of said first and second ends of said signal conductors and said ground plane to corresponding ones of said terminals;

means for activating said relay means to interconnect said first and second ends of one of said signal conductors and said ground plane conductor to said corresponding terminals to implement a coaxial cable transmission line.

9. A transmission line apparatus switchably connectable to a plurality of terminals comprising:

printed circuit board means having a plurality of layers, each of said layers capable of having at least one conductor deposited thereon;

two signal conductors, deposited on a first one of said layers of said printed circuit board, oriented substantially parallel to each other, extending across said first layer of said printed circuit board in a first direction and each of said signal conductors having first and second ends thereto;

two ground plane conductors deposited on a second one of said layers of said printed circuit board, oriented substantially parallel to said two signal conductors, extending across said second layer of said printed circuit board in said first direction and each located directly below a corresponding one of said two signal conductors so as to be coextensive therewith and said ground plane conductors having first and second ends thereto;

means connected to said two signal conductors and said two ground plane conductors for switchably connecting said first and second ends of said two signal conductors and said two ground plane conductors to said terminals.

10. The apparatus of claim 9 wherein said switchably connecting means comprises:

relay means for selectively connecting each of said first and second ends of said two signal conductors and said two ground plane conductors to corresponding ones of said terminals.

11. The apparatus of claim 10 further including:

means for activating said relay means to interconnect said first and second ends of one of said signal conductors and said associated ground plane conductor to said corresponding terminals to implement a coaxial cable transmission line.

12. The apparatus of claim 10, wherein said terminals connectable to said first end of said two signal conductors and said two ground plane conductors are connected to a load, said apparatus further including:

means for activating said relay means to interconnect said first and second ends of said two signal conductors and said second end of said two ground plane conductors to said corresponding terminals to implement a shield terminated at load end differential mode transmission line.

13. The apparatus of claim 10, wherein said terminals connectable to said first end of said two signal conductors and said two ground plane conductors are connected to a load, said apparatus further including:

means for activating said relay means to interconnect said first and second ends of said two signal conductors and said first end of said two ground plane conductors to said corresponding terminals to implement a shield terminated at instrument end differential mode transmission line.

14. The apparatus of claim 10, wherein said terminals connectable to said first end of said two signal conductors and said two ground plane conductors are connected to a load, said apparatus further including:

means for activating said relay means to interconnect said first and second ends of said two signal conductors and said first and second ends of said two ground plane conductors to said corresponding terminals to implement a shield terminated at both ends differential mode transmission line.

15. The apparatus of claim 9 further including:

two ground plane conductors deposited on a third one of said layers of said printed circuit board, oriented substantially parallel to said two signal conductors, extending across said third layer of said printed circuit board in said first direction and each located directly above a corresponding one of said two signal conductors so as to be coextensive therewith and said ground plane conductors having first and second ends thereto.

16. The apparatus of claim 15 further including:

means for activating said relay means to interconnect said first and second ends of one of said signal conductors and said associated ground plane conductors to said corresponding terminals to implement a coaxial cable transmission line.

17. The apparatus of claim 15, wherein said terminals connectable to said first end of said two signal conductors and said two ground plane conductors on both said second and third layers are connected to a load, said apparatus further including:

means for activating said relay means to interconnect said first and second ends of said two signal conductors and said second end of said two ground plane conductors on both said second and third layers to said corresponding terminals to implement a shield terminated at load end differential mode transmission line.

18. The apparatus of claim 15, wherein said terminals connectable to said first end of said two signal conductors and said two ground plane conductors on both said second and third layers are connected to a load, said apparatus further including:

means for activating said relay means to interconnect said first and second ends of said two signal conductors and said first end of said two ground plane conductors on both said second and third layers to said corresponding terminals to implement a shield terminated at instrument end differential mode transmission line.

19. The apparatus of claim 15 wherein said terminals connectable to said first end of said two conductors and said ground plane conductors are connected to a load, said apparatus further including:

means for activating said relay means to interconnect said first and second ends of said two conductors and said first and second ends of said ground plane conductors to said corresponding terminals to implement a shield terminated at both ends differential mode transmission line.

20. A transmission line apparatus switchably connectable to a plurality of terminals comprising:

printed circuit board means having at least two conductor bearing surfaces, each of said surfaces capable of having at least one conductor deposited thereon;

a plurality of signal conductors, deposited on a first one of said surfaces of said printed circuit board, oriented substantially parallel to each other, extending across said first one of said surfaces of said printed circuit board in a first direction and each of said signal conductors having a first and second ends thereto;

at least one ground plane conductor deposited on a second one of said surfaces of said printed circuit board, oriented substantially parallel to said plurality of signal conductors, extending across said second one of said surfaces of said printed circuit board in said first direction and located directly below said plurality of signal conductors so as to be coextensive therewith and having first and second ends thereto;

means connected to said plurality of signal conductors and said ground plane conductor for switchably connecting said first and second ends of said plurality of signal conductors and said ground plane conductor to said terminals.

21. The apparatus of claim 20 wherein said plurality of signal conductors comprise two conductors, said switchably connecting means comprises:

relay means for selectively connecting each of said first and second ends of said two conductors and said ground plane to corresponding ones of said terminals.

22. The apparatus of claim 21 further including:

means for activating said relay means to interconnect said first and second ends of one of said two conductors and said ground plane conductor to said corresponding terminals to implement a coaxial cable transmission line.

23. The apparatus of claim 21, wherein said terminals connectable to said first end of said two conductors and said ground plane conductor are connected to a load, said apparatus further including:

means for activating said relay means to interconnect said first and second ends of said two conductors and said second end of said ground plane conductor to said corresponding terminals to implement a shield terminated at laods end differential mode transmission line.

24. The apparatus of claim 21, wherein said terminals connectable to said first end of said two conductors and said ground plane conductor are connected to a load, said apparatus further including:

means for activating said relay means to interconnect said first and second ends of said two conductors and said first end of said ground plane conductor to said corresponding terminals to implement a shield terminated at instrument end differential mode transmission line.

25. The apparatus of claim 21, wherein said terminals connectable to said first end of said two conductors and said ground plane conductor are connected to a load, said apparatus further including:

means for activating said relay means to interconnect said first and second ends of said two conductors and said first and second end of said ground plane conductor to said corresponding terminals to implement a shield terminated at instrument and load end differential mode transmission line.

* * * * *